US011892928B2

United States Patent
Bhat

(10) Patent No.: US 11,892,928 B2
(45) Date of Patent: Feb. 6, 2024

(54) DELAYED THERMAL THROTTLING AND ASSOCIATED DATA ROUTING TECHNIQUES

(71) Applicant: WESTERN DIGITAL TECHNOLOGIES, INC., San Jose, CA (US)

(72) Inventor: Vinayak Bhat, Karnataka (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 149 days.

(21) Appl. No.: 17/180,659

(22) Filed: Feb. 19, 2021

(65) Prior Publication Data

US 2022/0206920 A1    Jun. 30, 2022

Related U.S. Application Data

(60) Provisional application No. 63/131,074, filed on Dec. 28, 2020.

(51) Int. Cl.
*G06F 11/30* (2006.01)
*G06F 3/06* (2006.01)
(Continued)

(52) U.S. Cl.
CPC ........ *G06F 11/3058* (2013.01); *G06F 3/0619* (2013.01); *G06F 3/0629* (2013.01);
(Continued)

(58) Field of Classification Search
CPC .......................... G06F 11/3058; G06F 11/3062
See application file for complete search history.

(56) References Cited

U.S. PATENT DOCUMENTS 8,472,274 B2    6/2013  Fai et al.
8,976,580 B2 *  3/2015  Lee .................... G11C 13/0004
                                               365/163

(Continued)

OTHER PUBLICATIONS

"NVM Express, Revision 1.3a", NVM Express Workgroup, Oct. 24, 2017, pp. 1-287 (Section 8.4.5, pp. 237-239; Section 5.21.1.4, pp. 152-153; Section 5.21.1.16, p. 162; Composite Temperature/Thermal Management, Figure 93, pp. 103-105, Figure 109, pp. 123, 125; Namespace, p. 7).

(Continued)

*Primary Examiner* — Raymond N Phan
(74) *Attorney, Agent, or Firm* — ARENTFOX SCHIFF LLP

(57) ABSTRACT

Aspects of a storage device are provided which delay thermal throttling in response to temperature increases based on different reliable temperatures for different types of cells, such as SLCs, hybrid SLCs and MLCs. Initially, a controller writes first data to a block of MLCs at a first data rate when a temperature of the block meets a first temperature threshold for MLCs. Subsequently, the controller writes second data to the block at a second data rate lower than the first data rate when the temperature of the block meets a second temperature threshold for SLCs. For hybrid SLCs, the MLCs are each configured to store a first number of bits, and the controller writes a second number of bits smaller than the first number of bits in each of one or more of the cells. Storage device performance is thus improved through delayed thermal throttling without compromising data integrity.

20 Claims, 8 Drawing Sheets

(51) Int. Cl.
*G06F 11/07* (2006.01)
*G06F 13/16* (2006.01)

(52) U.S. Cl.
CPC .......... *G06F 3/0679* (2013.01); *G06F 11/076* (2013.01); *G06F 11/3037* (2013.01); *G06F 13/1689* (2013.01)

(56) References Cited

U.S. PATENT DOCUMENTS

| | | |
|---|---|---|
| 9,489,146 B2 | 11/2016 | Erez |
| 9,760,136 B2 | 9/2017 | Rangarajan et al. |
| 9,990,964 B1 | 6/2018 | Lee et al. |
| 10,133,483 B2 | 11/2018 | Postavilsky et al. |
| 10,446,237 B1* | 10/2019 | Luo .................... G11C 16/3495 |
| 11,200,939 B1* | 12/2021 | Rehmeyer .......... G11C 11/40607 |
| 11,455,123 B2* | 9/2022 | Moon .................... G06F 3/0616 |
| 11,461,039 B2* | 10/2022 | Kurosawa ............. G06F 3/0604 |
| 2018/0129431 A1* | 5/2018 | Yang .................... G06F 11/3034 |
| 2019/0050153 A1 | 2/2019 | Yang et al. |
| 2020/0394114 A1* | 12/2020 | Lee ........................ G06F 11/076 |
| 2020/0402569 A1* | 12/2020 | He ...................... G11C 11/40626 |
| 2021/0216472 A1* | 7/2021 | Ueda .................... G06F 11/3089 |
| 2022/0043493 A1* | 2/2022 | Chen ....................... G06F 1/206 |
| 2022/0138073 A1* | 5/2022 | Luo .......................... G11C 7/04 |
| | | 714/6.1 |

OTHER PUBLICATIONS

"NVM Express, Base Specification, Revision 1.4b", NVM Express, Sep. 21, 2020, pp. 1-406 (Section 8.4.5, pp. 322-323; Section 5.21.1.4, pp. 210-211; Section 5.21.1.16, pp. 221-222; Composite Temperature/Thermal Management, Figure 198, pp. 121, 123-124, Figure 251, p. 180, 182; Section 5.14.1.13.1.13, pp. 151-153; Namespace, p. 7).

* cited by examiner

DELAYED THERMAL THROTTLING AND ASSOCIATED DATA ROUTING TECHNIQUES

CROSS-REFERENCE TO RELATED APPLICATION

This application claims the benefit of, and right of priority to, United States Provisional Patent Application No. 63/131,074, entitled "Data Routing Techniques to Delay Thermal Throttling," filed on Dec. 28, 2020, the entire contents of which are herein incorporated by reference as if fully set forth herein.

BACKGROUND

Field

This disclosure is generally related to electronic devices and more particularly to storage devices.

Background

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store data into the NAND cells of the flash memory. NAND cells may include single-level cells (SLCs) or multiple-level cells (MLCs). Examples of MLCs include triple-level cells (TLCs), quad-level cells (QLCs), and penta-level cells (PLCs). Generally, the flash storage device may write data directly into pages of SLC blocks. However, data can only be erased in blocks of flash memory. Therefore, when a SLC block becomes full, the flash storage device may relocate the data into empty blocks through a garbage collection process to free up space in the flash memory. For example, the data may be relocated into blocks of MLCs.

As data is stored and accessed, the temperature of the NAND cells may increase beyond their reliable operating temperatures. For example, if the temperature of MLCs exceeds a certain temperature threshold (e.g. 85° C.) due to data relocation from the SLCs, the integrity or reliability of the MLC data may be impacted. Therefore, in order to preserve system data integrity, thermal throttling may be applied to maintain the flash storage device below the temperature threshold. For example, when the temperature of the cells exceeds 85° C., the flash storage device may disable parallel access to one or more dies or otherwise reduce the rate of data written to the NAND cells to reduce power consumption and subsequently lower the temperature back below the threshold. However, this reduction in NAND operations may significantly reduce performance of the flash storage device (e.g. by at least 50%), may result in degraded user experience, and may prevent the system from meeting performance benchmarks.

SUMMARY

One aspect of a storage device is disclosed herein. The storage device includes a memory and a controller. The memory has a block of cells. The controller is configured to write first data to the block at a first data rate when a temperature of the block meets a first temperature threshold, and to write second data to the block at a second data rate lower than the first data rate when the temperature of the block meets a second temperature threshold higher than the first temperature threshold.

Another aspect of a storage device is disclosed herein. The storage device includes a memory and a controller. The memory has a block of cells each configured to store a first number of bits. The controller is configured to write a second number of bits smaller than the first number of bits in each of one or more of the cells at a first data rate when the temperature of the block meets a first temperature threshold, and to write data to the block at a second data rate lower than the first data rate when the temperature of the block meets a second temperature threshold higher than the first temperature threshold.

A further aspect of a storage device is disclosed herein. The storage device includes a memory and a controller. The memory has a block of MLCs. The controller is configured to store a single bit in each of one or more of the MLCs at a first data rate when a temperature of the block meets a first temperature threshold, and to write data to the block of MLCs at a second data rate smaller than the first data rate when the temperature of the block meets a second temperature threshold.

It is understood that other aspects of the storage device will become readily apparent to those skilled in the art from the following detailed description, wherein various aspects of apparatuses and methods are shown and described by way of illustration.

As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
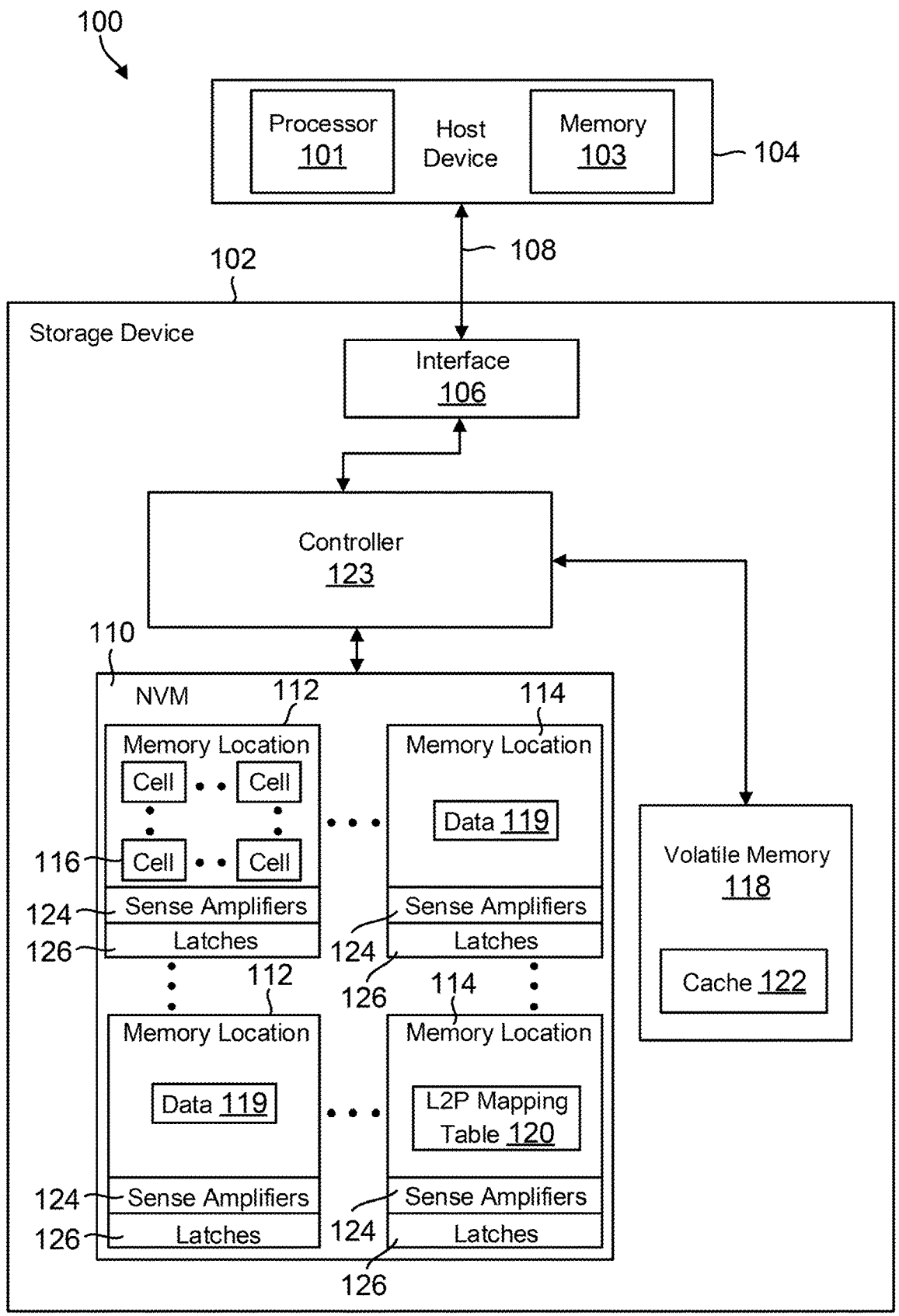
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

When a storage device performs thermal throttling, the storage device generally reduces a rate of data written to NAND cells as soon as the temperature of a die including the NAND cells exceeds a threshold. However, when identifying the threshold, the storage device typically does not distinguish between the different maximum reliable temperatures of the various types of NAND cells in the die. For example, even though MLCs and SLCs may have different maximum reliable operating temperatures (e.g. 85° C. and 100° C., respectively), the storage device typically performs thermal throttling only using the lower, maximum reliable temperature for MLCs (e.g. 85° C.). For instance, the storage device may reduce write data rates merely when the temperature of MLCs in the die reaches 85° C., even though the data stored in SLCs in the same die may still be reliable up to 100° C. As a result of this reduction in NAND operations, device performance may be inefficiently reduced and the user experience may be impacted.

Accordingly, to improve storage device performance and improve user experience, the present disclosure allows the storage device to delay the onset of thermal throttling at latest until a maximum reliable temperature for SLCs (e.g. 100° C.). Typically, a controller of the storage device routes data to memory in response to write commands from a host by storing data directly in SLC blocks at a first data rate (e.g. 500 Mbps). As the number of free SLC blocks decreases, the controller relocates the data in SLC blocks to MLC blocks. This relocation may increase the temperature of the MLC blocks. When the temperature of the MLC blocks increases to a first temperature threshold (e.g. a maximum reliable temperature for MLCs, such as 85° C.), the controller changes how the data is routed to memory by disabling data relocation from the SLC blocks to the MLC blocks and by restricting writing of host data to SLC blocks. However, the controller does not perform thermal throttling at this time, thus allowing data to be written at the same data rate (e.g. 500 Mbps) to the SLC blocks before and after the first temperature threshold.

The controller may then continue writing host data in response to write commands to SLC blocks at the first data rate. If the number of available SLC blocks becomes critical (e.g. less than 2% or some other threshold of the total number of SLC blocks), the controller then configures any free MLC blocks (open or partially programmed blocks) as hybrid SLC blocks. A hybrid SLC block is an MLC block which includes cells in which the controller only writes a single bit (i.e. the controller effectively writes data to the MLC block as if it was an SLC block, one bit per cell). After configuring the MLC blocks as hybrid SLC blocks, the controller then continues writing host data in response to write commands to the hybrid SLC blocks, which may increase the temperature of the hybrid SLC blocks. If the temperature of the hybrid SLC blocks (formerly the MLC blocks) increases to a second temperature threshold (e.g. a maximum reliable temperature for SLCs, such as 100° C.), the controller may now enable thermal throttling. For example, the controller may reduce the rate of data written to SLC blocks, hybrid SLC blocks, and MLC blocks to a smaller, second data rate (e.g. 250 Mbps), e.g. by disabling parallel access to dies or in other manners. The controller may also enable thermal throttling if the number of available hybrid SLC blocks becomes critical (e.g. less than 2% or some other threshold of the total number of hybrid SLC blocks).

As a result, rather than employing thermal throttling (and consequently reducing performance) when the temperature of the storage device exceeds the lower, maximum reliable temperature for MLCs, the storage device of the present disclosure delays thermal throttling at latest until the temperature exceeds the higher, maximum reliable temperature for SLCs. In this way, the storage device of the present disclosure provides improved user experience, enables meeting of performance benchmarks, and maintains data reliability through efficient NAND block usage.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

The storage device 102 includes a memory. For example, in the exemplary embodiment of FIG. 1, the storage device 102 may include a non-volatile memory (NVM) 110 for persistent storage of data received from the host 104. The NVM 110 can include, for example, flash integrated circuits, NAND memory (e.g., SLC memory, MLC memory, TLC memory, QLC memory, PLC memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the exemplary embodiment of FIG. 1, each memory location 112 may be a die 114 including multiple planes each including multiple blocks of multiple cells 116. Alternatively, each memory location 112 may be a plane including multiple blocks of the cells 116. The cells 116 may be single-level cells, multi-level cells, triple-level cells, quad-level cells, and/or penta-level cells, for example. Other examples of memory locations 112 are possible; for instance, each memory location may be a block or group of blocks. Each memory location may include one or more blocks in a 3-D NAND array. Each memory location 112 may include one or more logical blocks which are mapped to one or more physical blocks. Alternatively, the memory and each memory location may be implemented in other ways known to those skilled in the art.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
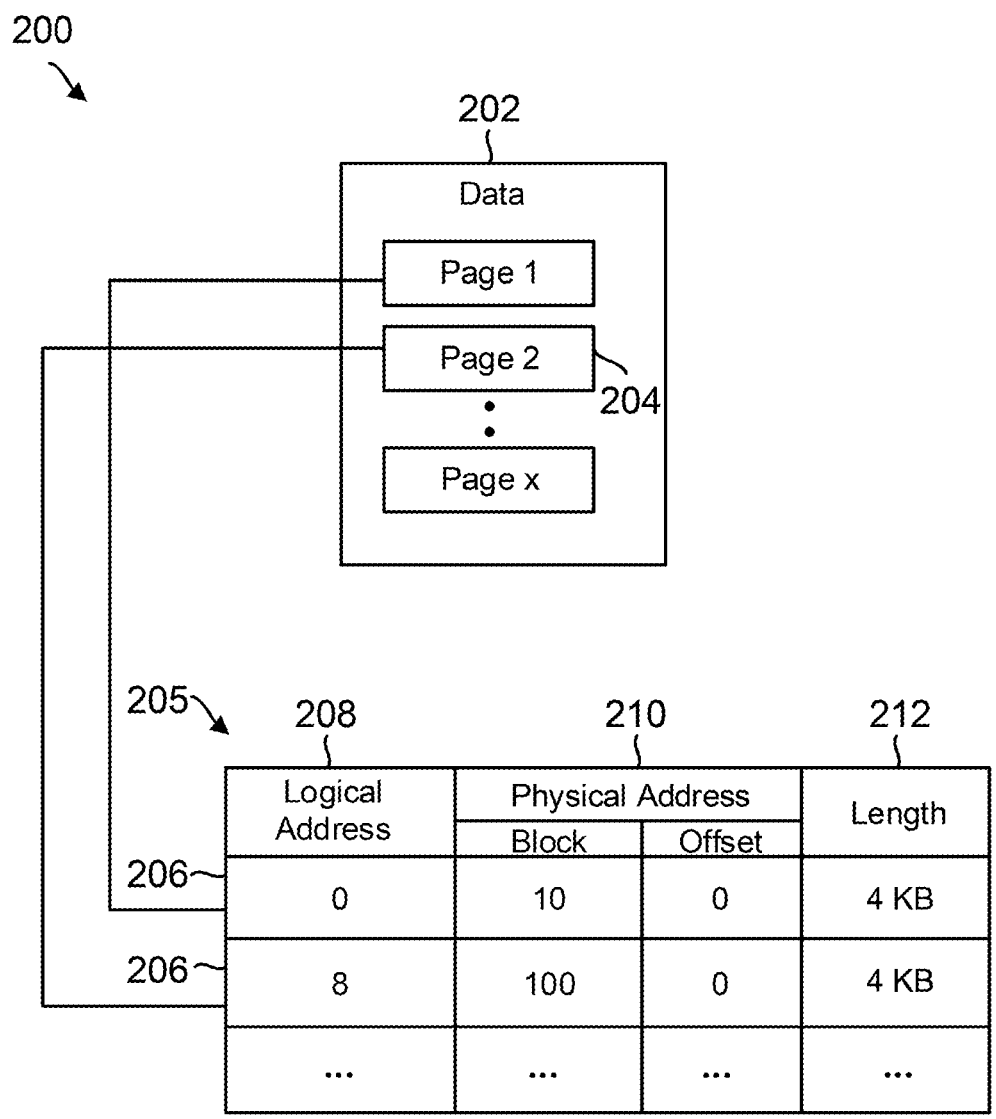
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
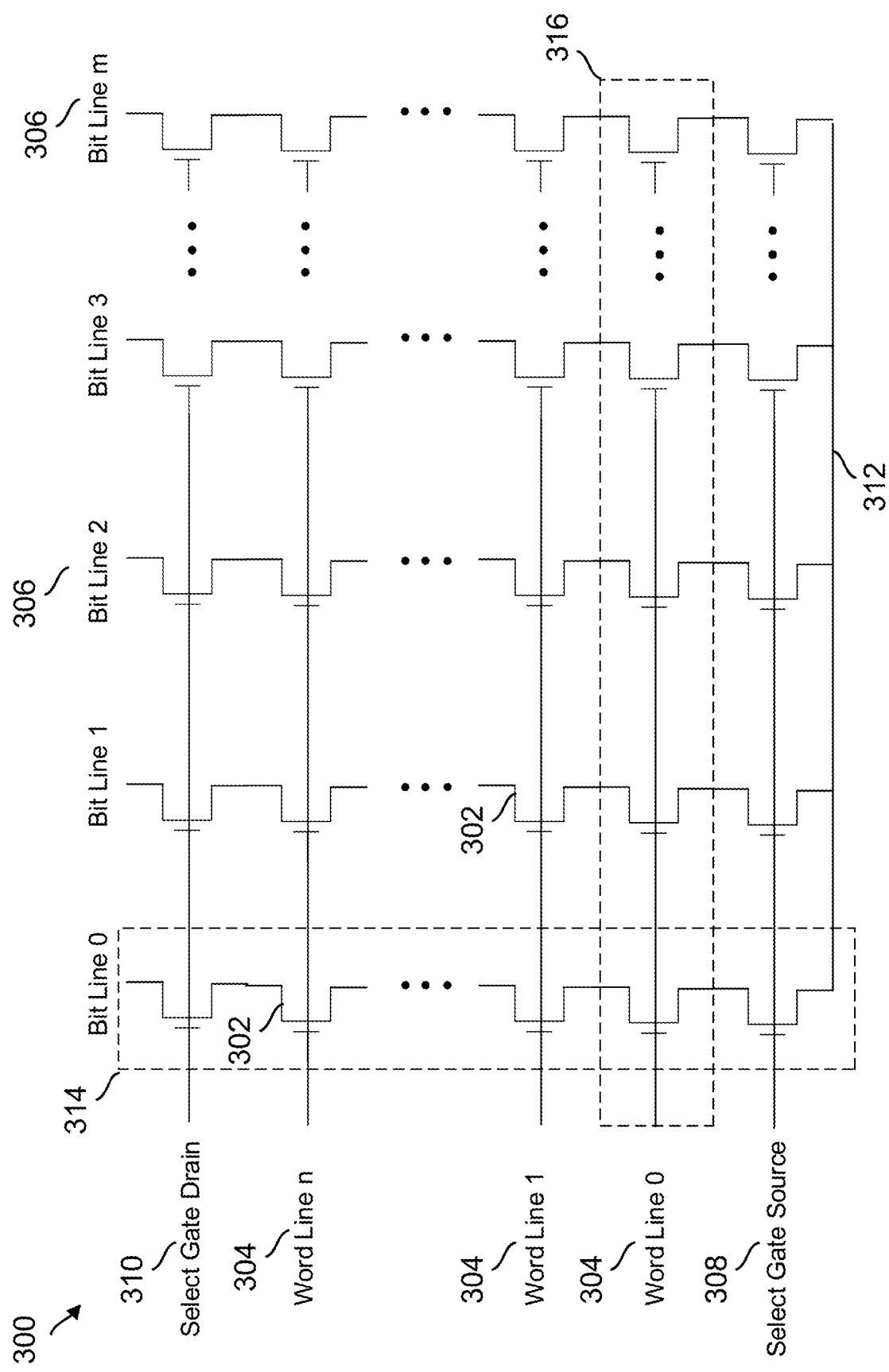
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block of a die 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
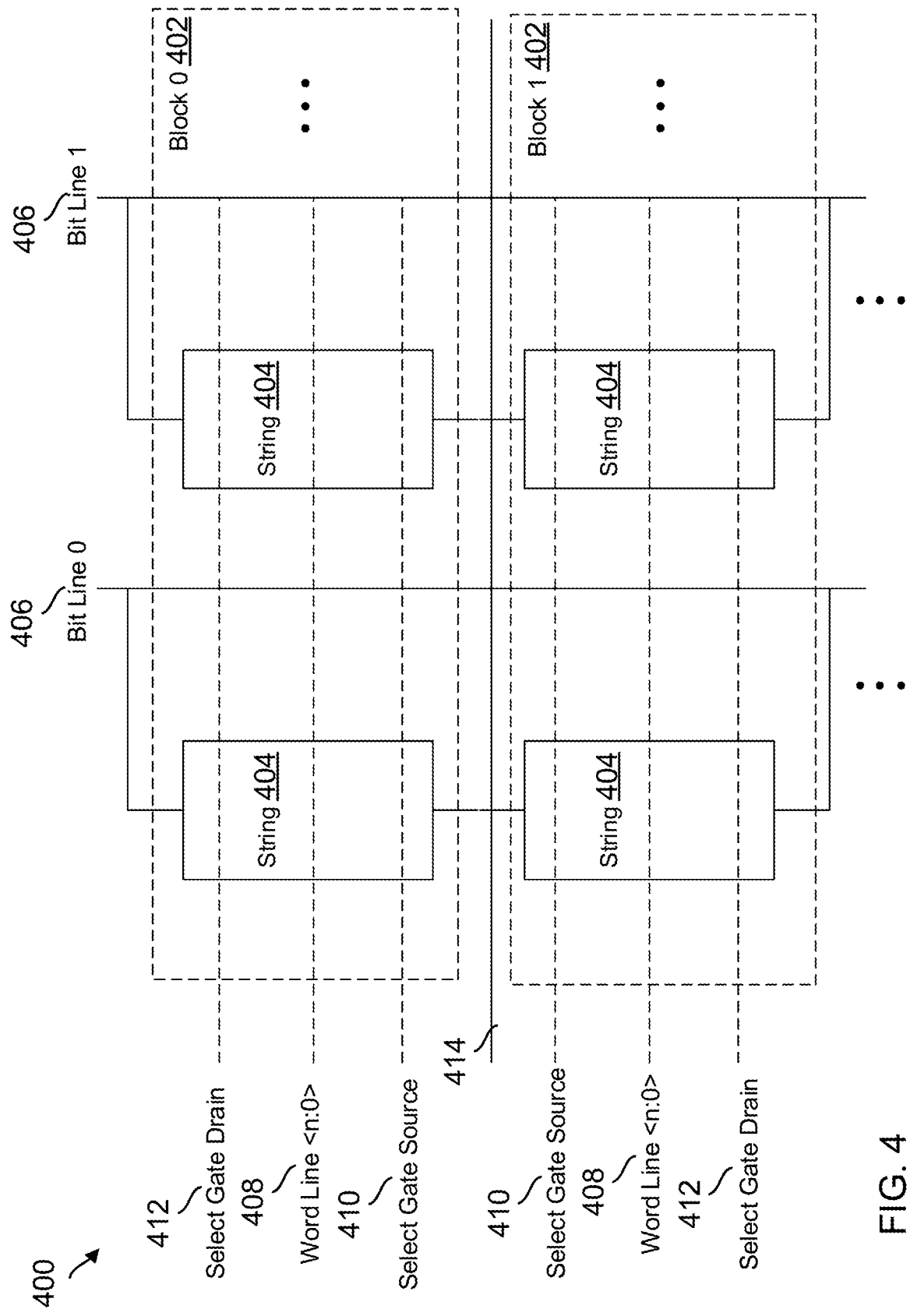
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks of a die 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by sending a command to apply the program voltage to the cell 302 on the word line 304, 408 until the cell reaches the threshold voltage, and during an erase operation, the controller may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller may similarly send commands to apply read or program voltages to the word lines to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. When programming TLCs, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 5:
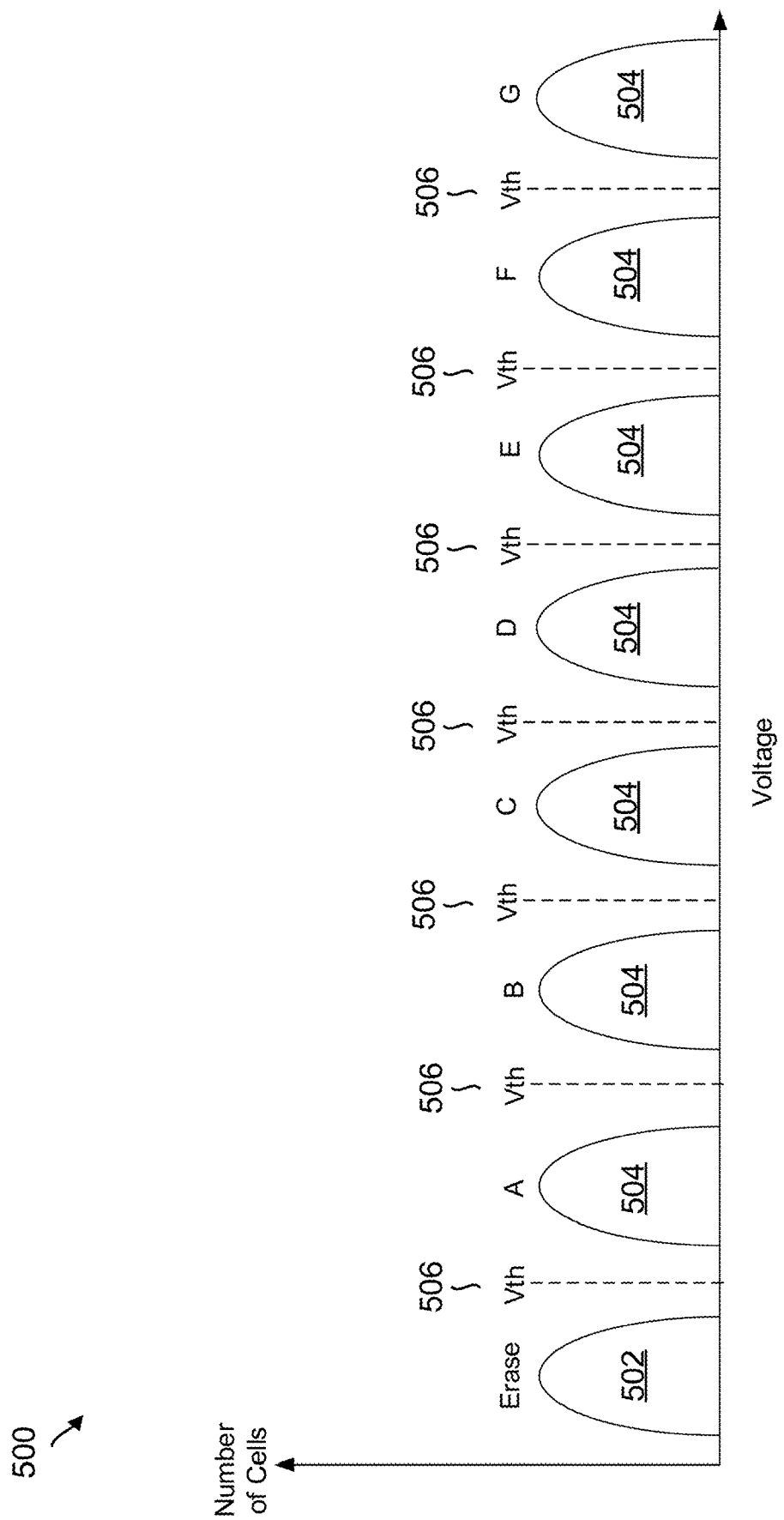
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 corresponding to logic '111' and multiple program states 504 (e.g. A-G) corresponding to other logic values '000-110'. The program states 504 may be separated by different threshold voltages 506. Initially, the cells 116, 302 may be in the erase state 502, e.g. after the controller 123 erases a block 402 including the cells. When the controller 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states (e.g. erase and A-N).

Figure 6:
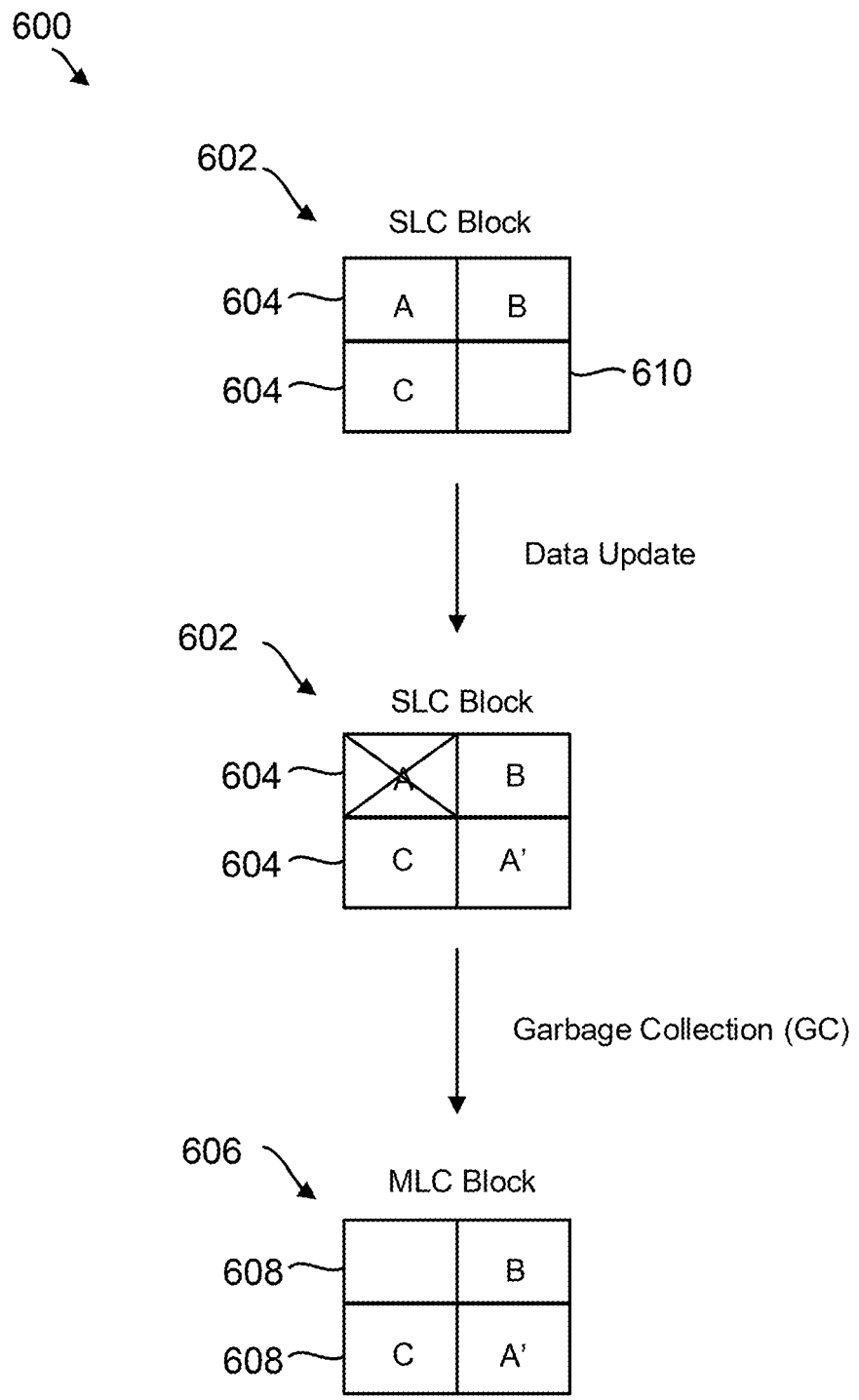
FIG. 6 is a conceptual diagram illustrating an example of a garbage collection (GC) process that may be implemented in the storage device of FIG. 1.

FIG. 6 is a conceptual diagram 600 of an example of a garbage collection process in which data stored in pages 604 of a block 602 of SLC cells are relocated to pages 608 of a block 606 of MLC cells. The data may correspond to the data 119 of FIG. 1, the blocks 602, 606 may correspond to the blocks 402 of FIG. 4, and the SLC/MLC cells may correspond to the cells 116, 302 of FIGS. 1 and 3. Each page 604, 608 includes data stored in multiple cells along a same row or word line (e.g. word line 304, 408) of the NVM. Thus, each page 604 may include data stored in a row of the cells 116 of one block, while each page 608 may include data stored in a row of the cells 116 of another block. For simplicity of illustration, the example of FIG. 6 illustrates the blocks 602, 606 each including only four pages 604, 608. However, it should be recognized that each block may include any number of pages.

In the example of FIG. 6, data represented by identifiers A, B, and C are stored in different pages 604 of the block 602. Originally, the data A, B, and C are stored in three pages of the block 602 in response to write commands from the host device, leaving one of the pages free in this example. When the storage device receives new or updated data, this data is stored in the free page 610. For example, updated data A' may be received from the host device and written to the free page 610. Since data cannot be overwritten in flash memory, the invalid data A remains stored in the block 602. As a result of new data and invalid data, the block 602 may quickly become full.

To free space in the SLC block, original and updated data in the block 602 may be transferred to the block 606. The invalid data remain in the old block. For instance, in the example of FIG. 6, the original data B and C and the updated data A' are read from the pages 604 of the block 602 and written to one or more pages 608 of the block 606. The invalid data A remains in the block 602. When the block 602 is subsequently erased, the invalid data is discarded, and the block 602 may be reused to store new data.

Referring back to FIG. 1, when there are no empty cells in an SLC block (e.g. block 602) available for storing data, the controller 123 performs garbage collection (e.g. as described above with respect to FIG. 6) by transferring data from the cells 116 in the SLC block to available cells in an MLC block (e.g. block 606). The controller 123 may then erase the SLC block including the cells 116. Once the cells 116 are free, the controller may continue to write data into the empty cells.

As the cells 116 in the MLC block (e.g. block 606) are read or written or as the ambient temperature of the storage device 102 increases, the cells may exceed their reliable operating temperatures, compromising data integrity. For example, as the temperature of a cell increases, the threshold voltages 506 of the cell separating the different program states 504 may change. Once the temperature reaches a certain temperature (e.g. a maximum reliable operating temperature), the threshold voltages may no longer sufficiently separate the different program states, thus causing potential read errors and impacting data reliability. As MLCs have more program states and thus have less spaced apart threshold voltages 506 than SLCs, the maximum reliable operating temperature may be lower for MLCs than for SLCs. For example, the maximum reliable temperature for MLCs (the temperature at which point a read error may occur for MLCs due to the threshold voltage changes) may be 85° C., while the maximum reliable temperature for SLCs (the temperature at which point a read error may occur for SLCs due to the threshold voltage changes) may be 100° C. These maximum reliable temperatures are merely examples; in other examples, the maximum reliable temperature for MLCs or SLCs may respectively be different than 85° C. and 100° C., e.g., depending on whether the MLC is a TLC, QLC, PLC, due to process variations of the storage device, or based on other factors. However, regardless of example, the maximum reliable temperature for SLCs will be higher than the maximum reliable temperature for MLCs.

To prevent the temperature of cells 116 in a block 402 from exceeding a maximum reliable temperature, and thus to preserve the integrity of the data in the block, the storage device 102 may apply thermal throttling. When the controller performs thermal throttling, the controller 123 may decrease a rate of data written to the cells 116 in a block 402 of a die 114 based on the temperature of the die 114. The decrease in data rate may serve to reduce the temperature of the die and cool down the storage device. As an example, the blocks 402 of cells 116 may be located on different dies 114, and the controller 123 may disable parallel access to the cells 116 on one or more of the dies, requiring the cells on the other die to be accessed serially. The temperature of the cells 116 may thereby be reduced since the cells are accessed less frequently. Alternatively, the controller may employ throttling by preventing reads or writes to one or more dies, restricting or limiting access to one or more memory locations on a die, or perform other data rate reducing schemes to decrease the temperature of the storage device 102.

However, thermal throttling based on temperature of a die 114 may reduce system performance, especially when the die 114 includes multiple types of blocks of cells (e.g. SLCs, MLCs, etc.). For instance, referring back to FIGS. 1 and 4 and as described above, a block 402 of cells 116 which operate as SLCs may typically have a maximum reliable operating temperature of 100° C., while a block 402 of cells 116 which operate as MLCs may typically have a maximum reliable temperature of 85° C. Therefore, if the controller performs thermal throttling at the lower, maximum reliable temperature for MLCs (e.g. 85° C.) to preserve data integrity, access to SLCs with higher reliable temperatures may inefficiently be impacted.

Accordingly, to improve device performance, the controller 123 may be configured to delay the thermal throttling until at latest the higher, maximum reliable temperature of SLCs (e.g. 100° C.). For example, as the controller is writing data to cells 116 in SLC blocks (e.g. block 602) and relocating data from cells in SLC blocks to cells 116 in MLC blocks (e.g. block 606), the controller may monitor the temperature of the die 114 including the MLC blocks. When the controller determines that the temperature meets a first temperature threshold (e.g. the maximum reliable temperature for MLCs), then rather than performing thermal throttling at this time, the controller disables further data relocation from the SLC blocks to the MLC blocks. Thus, writing of host data is limited to SLC blocks, and the controller may continue to write data to SLC blocks above the maximum reliable temperature for MLCs.

Additionally, the controller 123 may transfer data from cells 116 in SLC blocks to cells in MLC blocks at different transfer rates as the temperature increases towards the first temperature threshold. For example, the controller 123 may increase the rate of data relocation from blocks 602 to blocks 606 when the controller determines that the temperature is five degrees (or some other number or threshold) lower than the first temperature threshold. As a result, the controller may increase the number of SLC blocks available for host writes (by increasing the rate of data relocation from SLCs to MLCs) before disabling further MLC data relocation at the first temperature threshold.

After the temperature reaches the first temperature threshold, the controller 123 may continue writing host data to available SLC blocks, and the controller may continue to monitor the temperature of the die including the SLC blocks. If the controller determines that the number of available SLC blocks becomes critical (e.g. less than 2% or some other number of the total number of free SLC blocks), the controller may configure any remaining, free MLC blocks as hybrid blocks. When writing data to cells 116 in a hybrid block, the controller writes a smaller number of bits than the number of bits capable of being stored. For example, in a hybrid SLC block, the controller may only write a single bit to each MLC in the block even though each MLC may store two or more bits. As a result, the maximum reliable temperature of the MLC block may effectively be increased to that of an SLC block.

The controller 123 may then continue writing host data in response to write commands to the hybrid SLC blocks, and the controller may continue to monitor the temperature of the die including the hybrid SLC blocks. If the controller determines that the temperature of the hybrid SLC blocks (or the SLC blocks) increases to a second temperature threshold (e.g. a maximum reliable temperature for SLCs, such as 100° C.), the controller performs thermal throttling in response to the determination. For example, the controller may reduce the rate of data written to the blocks 602, 606 by disabling parallel access to the dies, preventing reads or writes to one or more dies, restricting or limiting access to one or more blocks on a die, or employing other data rate reducing schemes to decrease the temperature of the block. Additionally, if the controller determines that the number of available hybrid SLC blocks becomes critical (e.g. less than 2% or some other number of the total number of hybrid SLC blocks), the controller may similarly enable thermal throttling in response to the determination.

Figure 7:
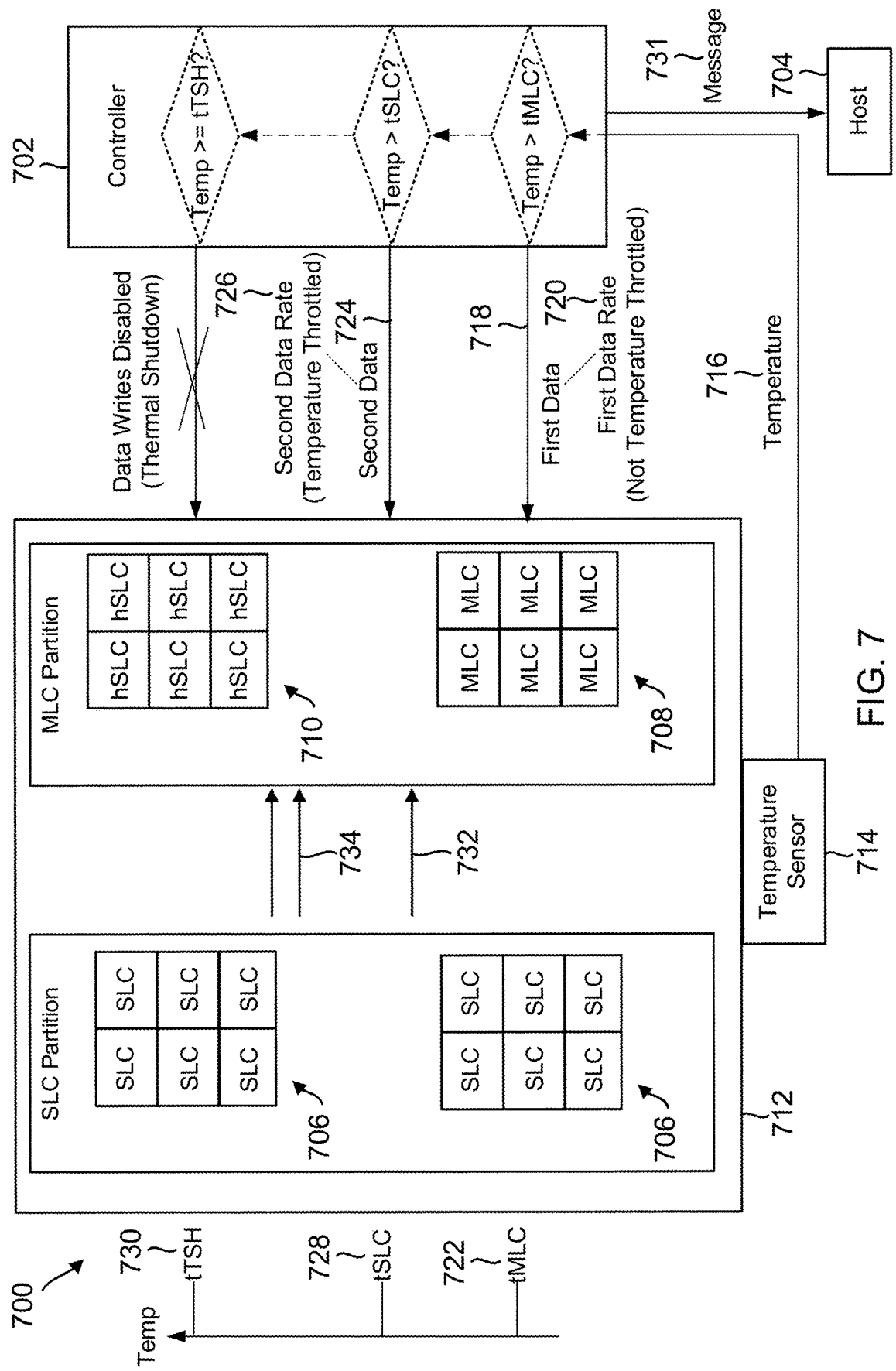
FIG. 7 is a conceptual diagram illustrating a controller writing data to a block at different data rates corresponding to different temperatures of the block using delayed thermal throttling in the storage device of FIG. 1.

FIG. 7 illustrates an example diagram 700 of a controller 702 of the storage device that writes data received from a host device 704 in one or more blocks 706, 708, 710 at different data rates as a function of temperature using delayed thermal throttling. The blocks 708 may include cells which store more bits than the cells of the blocks 706. For example, blocks 706 may include pages of SLCs, while blocks 708 may include pages of MLCs (e.g. 2-bit cells, TLCs, QLCs, PLCs, etc.). The controller 702 may configure one or more blocks 708 of the MLCs as a hybrid block 710 which stores less bits than the number of bits capable of being stored in each cell of the block. For instance, hybrid block 710 may be a hybrid SLC block which may be configured by the controller to store only one bit, e.g. as SLCs, in response to a write command. Referring to FIG. 1, the controller 702 may correspond to the controller 123, the blocks 706 of SLCs may correspond to blocks 602 including cells 116, and the blocks 708 of MLCs and hybrid blocks 710 may correspond to blocks 606 including cells 116. The blocks 706 and blocks 708, 710 may be stored in separate partitions of a die 712 (e.g. die 114 in FIG. 1). For example, blocks 706 may be stored in an SLC partition of die 712, while blocks 708, 710 may be stored in an MLC partition of the die 712.

The controller 702 may communicate with a temperature sensor 714 coupled to the die 712. The controller 702 may determine a temperature 716 of the cells in the blocks 706, 708, 710 based on periodically monitored readings from the temperature sensor 714. Upon determining the temperature, the controller 702 may apply delayed thermal throttling to the die 712 based on the different maximum reliable temperatures of the blocks 706, 708, 710. For instance, the controller 702 may initially write first data 718 (e.g. data in response to one write command) to the blocks 706, 708 at a first data rate 720 when the temperature 716 meets a maximum reliable temperature for MLCs (tMLC 722). The controller 702 may also configure one or more blocks 708 as hybrid blocks 710 when the temperature 716 meets tMLC 722 or when the number of available blocks 706 is below an SLC block threshold (e.g. 2% or some other threshold of the total number of SLC blocks). Subsequently, the controller 702 may write second data 724 (e.g. data in response to another write command) to the blocks 708, 710 at a second data rate 726 (a throttled rate less than first data rate 720) when the temperature 716 meets a maximum reliable temperature for SLCs (tSLC 728) higher than tMLC. The controller 702 may also write data at the second data rate 726 when the number of available hybrid blocks 710 is below an SLC hybrid block threshold (e.g. 2% or some other threshold of the total number of hybrid blocks). Additionally, the controller may also perform a thermal shutdown, or disable all data writes, when the temperature 716 meets a thermal shutdown temperature (tTSH 730) higher than tSLC. For instance, in one example, tMLC may be 85° C., tSLC may be 100° C., and tTSH may be 110° C. Alternatively, tMLC, tSLC, and tTSH may be different in other examples. Before thermal throttling (e.g. at tSLC) or thermal shutdown (e.g. at TSH) occurs, the controller may send a message 731 notifying the host device 704 of such event.

To free up blocks 706 prior to the temperature 716 reaching tMLC 722, the controller 702 may transfer data from blocks 706 to blocks 708, 710 (e.g. in GC) at different transfer rates 732, 734 depending on the temperature 716. For example, the controller may perform data relocation at slower transfer rate 732 when the temperature is more than five degrees or other threshold below tMLC 722 (e.g. less than 80° C.), and the controller may perform data relocation at faster transfer rate 734 when the temperature is less than five degrees or similar threshold below tMLC 722 (e.g. between 80° C. and 85° C.). If the controller 702 determines that the temperature 716 later meets tMLC 722 (e.g. 85° C.), the controller may disable data relocation from the blocks 706 to the blocks 708, 710 and limit subsequent host writes only to SLC blocks or hybrid SLC blocks.

After disabling data relocation from blocks 706 to blocks 708 and configuring hybrid blocks 710, the controller 702 may continue writing data (e.g. first data 718) at the first data rate 720 to the blocks 706, 710 until the temperature 716 increases to tSLC 728. When the temperature 716 meets tSLC, the controller may perform thermal throttling and consequently write subsequent data (e.g. second data 724) at the second data rate 726 to the blocks 706, 710. If the temperature 716 later decreases below tMLC 722 in response to the throttled rate, the controller may re-enable data relocation from blocks 706 to blocks 708, 710, and the controller may again write data at the first data rate 720 to the blocks 706, 708, 710 without thermal throttling. Otherwise, if the temperature 716 increases to tTSH 730 despite the throttled rate, the controller may initiate a thermal shutdown and disable further data writes to the blocks 706, 710 until the temperature decreases back below tMLC 722 (or tSLC 728).

Figure 8:
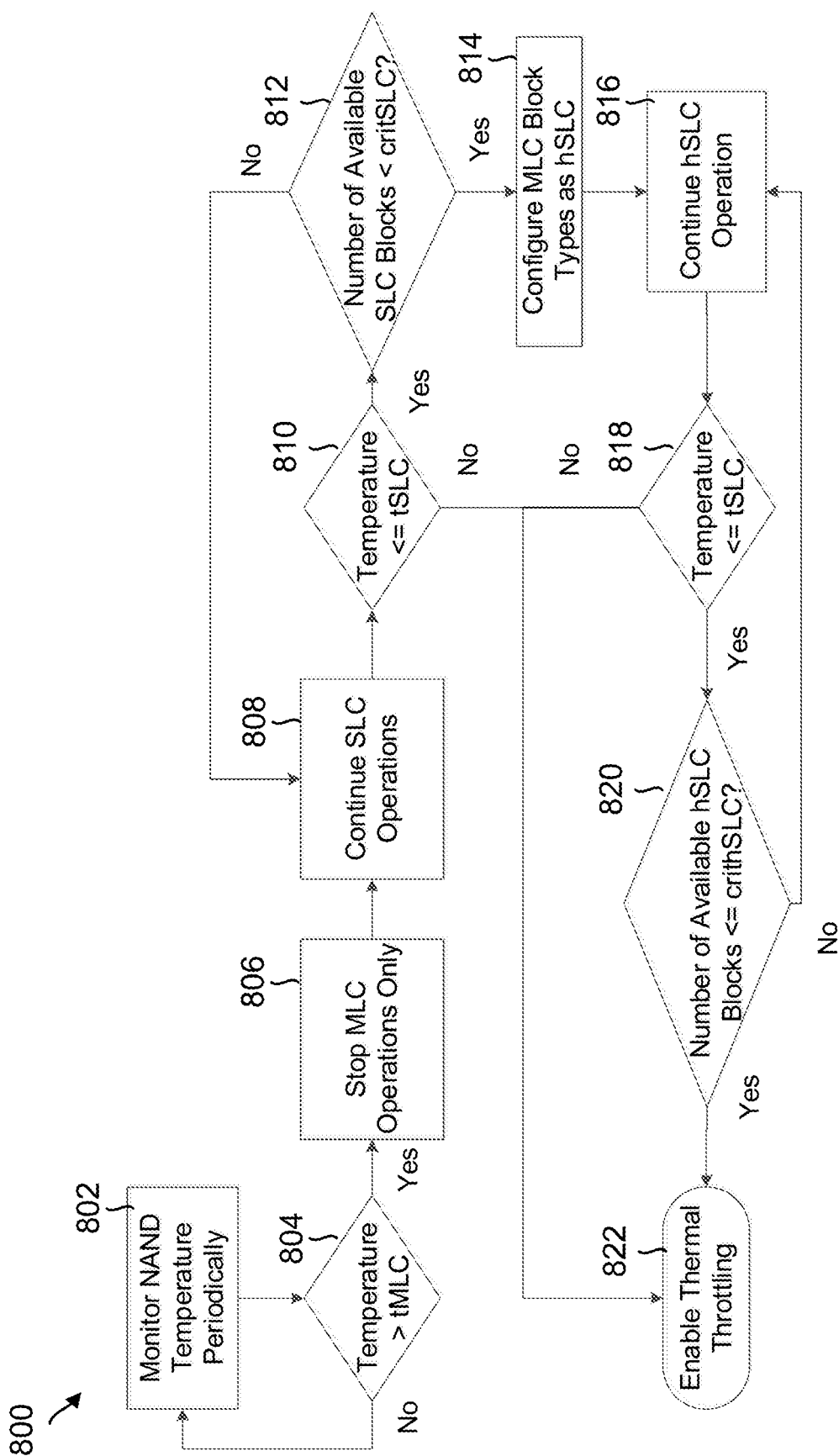
FIG. 8 is a flow chart illustrating an exemplary method for delaying thermal throttling in the storage device of FIG. 1.

FIG. 8 is a flowchart 800 illustrating an exemplary embodiment of a method for delaying thermal throttling. For example, the method can be carried out in a storage device 102, such as the one illustrated in FIG. 1. Each of the steps in the flow chart can be controlled using the controller as described below (e.g. controller 123, 702), or by some other suitable means.

As represented by block 802, the controller may monitor NAND temperature periodically. For example, referring to FIGS. 1 and 7, the controller 123, 702 may acquire a temperature 716 of blocks 402, 706, 708, 710 in die 114, 712 in the NVM 110 at regular intervals from temperature sensor 714, for example, periodically every minute or other amount of time.

As represented by block 804, the controller may determine whether the acquired temperature is greater than a maximum reliable temperature for MLCs. For example, referring to FIGS. 1 and 7, the controller 123, 702 may determine whether temperature 716 is greater than tMLC 722. In such case, then as represented by block 806, the controller may stop performing MLC operations. For example, referring to FIGS. 1 and 7, the controller 123, 702 may disable transferring data from blocks 706 to blocks 708 during GC, such as described above with respect to FIG. 6. Moreover, as represented by block 808, the controller may continue performing SLC operations. For example, referring to FIGS. 1 and 7, the controller 123, 702 may continue to write data to blocks 706 including SLC cells. The controller may also continue to monitor NAND temperature as described above at block 802.

As represented by block 810, the controller may determine whether the temperature of the die including the SLC blocks has not exceeded a maximum reliable temperature for SLCs. For example, referring to FIGS. 1 and 7, the controller 123, 702 may determine whether temperature 716 has not exceeded tSLC 728. If so, then as represented by block 812, the controller may determine whether a number of available SLC blocks for data writes is less than a critical threshold (critSLC). For example, referring to FIGS. 1 and 7, the controller 123, 702 may determine whether the number of blocks 706 available for writing data to SLCs is less than 2% of the total number of blocks 706 or other threshold amount. If not, then the controller may continue to write data to SLCs as described above at block 808. Otherwise, as represented by block 814, the controller may configure the MLC blocks as hybrid SLC blocks. For example, referring to FIGS. 1 and 7, the controller 123, 702 may configure blocks 708 of MLCs as hybrid blocks 710 and only write single bits of data to cells in those blocks to effectively the cells in those blocks as SLCs. Afterwards, as represented by block 816, the controller may continue performing hybrid SLC operations. For example, referring to FIGS. 1 and 7, the controller 123, 702 may continue to write data to blocks 710 including MLC cells treated as SLC cells. The controller may also continue to monitor NAND temperature as described above at block 802.

As represented by block 818, the controller may determine whether the temperature of the die including the hybrid SLC blocks has not exceeded the maximum reliable temperature for SLCs. For example, referring to FIGS. 1 and 7, the controller 123, 702 may determine whether temperature 716 has not exceeded tSLC 728. If so, then as represented by block 820, the controller may determine whether a number of available hybrid SLC blocks for data writes is less than another critical threshold (crithSLC). For example, referring to FIGS. 1 and 7, the controller 123, 702 may determine whether the number of blocks 710 available for writing data to hybrid SLCs is less than 2% of the total number of blocks 710 or other threshold amount. If not, then the controller may continue to write data to hybrid SLCs as described above at block 816. Otherwise, as represented by block 822, the controller may enable thermal throttling. For example, referring to FIGS. 1 and 7, the controller 123, 702 may reduce the data rate of data writes to the hybrid SLC blocks (e.g. from first data rate 720 to second data rate 726). Moreover, if the controller determines at block 818 (or at block 810) that the temperature has exceeded the maximum reliable temperature for SLCs (e.g. temperature 716 has exceeded tSLC 728), then the controller may similarly enable thermal throttling at block 822.

Thus, the controller may be configured to write first data to the block at a first data rate when a temperature of the block meets a first temperature threshold, and the controller may be configured to write second data to the block at a second data rate lower than the first data rate when the temperature of the block meets a second temperature threshold higher than the first temperature threshold. For example, referring to FIGS. 1 and 7, the controller 123, 702 may write first data 718 to blocks 706, 710 at first data rate 720 when temperature 716 exceeds tMLC 722, and the controller may write second data 724 to blocks 706, 710 at second data rate 726 when temperature 716 exceeds tSLC 728. Moreover, referring to FIG. 8, the controller may continue SLC operations at block 808 and hybrid SLC operations at block 816 after determining at block 804 that the temperature of the die exceeds a maximum reliable temperature for MLCs, and the controller may enable thermal throttling at block 822 after determining at block 810 or block 818 that the temperature of the die exceeds a maximum reliable temperature for SLCs.

Each of the cells may be configured to store a first number of bits, and the controller may be further configured to write a second number of bits smaller than the first number of bits in each of one or more of the cells when the temperature of the block meets the first temperature threshold. For example, referring to FIGS. 1 and 7, the cells in block 710 may be MLCs which store two or more bits, and the controller 123, 702 may write one bit in each of the MLCs (effectively treating the MLCs as SLCs) when the temperature 716 exceeds tMLC 722. Moreover, referring to FIG. 8, the controller may configure MLC block types as hybrid SLC blocks at block 814 and the controller may continue hybrid SLC operations at block 816 after determining at block 804 that the temperature exceeds a maximum reliable temperature for MLCs.

The controller may be configured to write the second number of bits when a number of available SLC blocks is below a SLC block threshold. For example, referring to FIGS. 1 and 7, the controller may configure block 710 as a hybrid block, and write one bit in each of the cells in block 710, when the number of blocks 706 including SLC cells that are available for data writes is less than 2% of the total number of SLC blocks in the storage device or some other threshold (critSLC). Moreover, referring to FIG. 8, the controller may perform hybrid SLC operations at block 816 after determining at block 812 that the number of available SLC blocks has fallen below critSLC.

The controller may be configured to write the second data to the block at the second data rate when a number of available MLC blocks is below a hybrid SLC block threshold. For example, referring to FIGS. 1 and 7, the controller 123, 723 may write second data 724 to block 710 at second data rate 726 when the number of blocks 708, 710 including MLC cells (or hybrid SLC cells) that are available for data writes is less than 2% of the total number of MLC or hybrid SLC blocks in the storage device or some other threshold (crithSLC). Moreover, referring to FIG. 8, the controller may enable thermal throttling at block 822 after determining at block 820 that the number of available MLC or hybrid SLC blocks has fallen below crithSLC.

The controller may be configured to disable data relocation to the block when the temperature of the block meets the first temperature threshold. For example, referring to FIGS. 1 and 7, the controller 123, 723 may disable transfers of data from blocks 706 to blocks 708, 710 (e.g. in GC) when temperature 716 exceeds tMLC 722. Moreover, referring to FIG. 8, the controller may stop MLC operations at block 806 after determining at block 804 that the temperature exceeds a maximum reliable temperature for MLCs.

The block of cells may include MLCs, the memory may further have a block of SLCs, and the controller may be further configured to transfer stored data from the SLCs to the MLCs at increasing transfer rates when the temperature of the block is below the first temperature threshold. For example, referring to FIGS. 1 and 7, the controller 123, 723 may transfer data stored in blocks 706 including SLC cells to blocks 708, 710 including MLC cells (or hybrid SLC cells) at different transfer rates 732, 734 when temperature 716 is below tMLC 722. Moreover, referring to FIG. 8, the controller may relocate data from SLCs to MLCs at faster rates after determining at block 804 that the temperature is below the maximum reliable temperature for MLCs, and thus prior to stopping MLC operations at block 806.

The controller may be further configured to provide a message to a host of a decrease in data rate when the temperature of the block meets the second temperature threshold. For example, referring to FIGS. 1 and 7, the controller 123, 723 may provide message 731 to host 704 when temperature 716 exceeds tSLC 728. Moreover, referring to FIG. 8, the controller may send the message to the host after determining at block 810 or 818 that the temperature has exceeded the maximum reliable temperature for SLCs and prior to performing thermal throttling at block 822.

The controller may be further configured to disable data writes to the block when the temperature of the block meets a third temperature threshold above the second temperature threshold. For example, referring to FIGS. 1 and 7, the controller 123, 723 may perform a thermal shutdown and refrain from writing any data to blocks 706, 708, 710 when temperature 716 exceeds tSH 730. Moreover, referring to FIG. 8, the controller may continue to monitor NAND temperature periodically at block 802 after enabling thermal throttling at block 822, and the controller may perform a shutdown of the storage device in response to a determination that the temperature has exceeded tTSH. The controller may also send message 731 to the host prior to thermal shutdown after making such determination.

Accordingly, the storage device of the present disclosure improves performance and user experience without compromising data integrity based on different maximum reliable temperatures for SLCs and MLCs. Rather than employing thermal throttling when the temperature of the storage device exceeds the lower, maximum reliable temperature for MLCs, the storage device delays thermal throttling until the temperature at latest exceeds the higher, maximum reliable temperature for SLCs. In this way, the storage device provides improved user experience, enables meeting of performance benchmarks, and maintains data reliability through efficient NAND block usage.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
   a memory having a block of cells; and
   a controller configured to write first data to the block at a first data rate when a temperature of the block meets a first temperature threshold, to write second data to the block at a second data rate lower than the first data rate when the temperature of the block meets a second temperature threshold higher than the first temperature threshold, and to disable data writes to the block when the temperature of the block meets a third temperature threshold above the second temperature threshold.

2. The storage device of claim 1, wherein each of the cells are configured to store a first number of bits, and wherein the controller is further configured to write a second number of bits smaller than the first number of bits in each of one or more of the cells when the temperature of the block meets the first temperature threshold.

3. The storage device of claim 1, wherein the controller is further configured to write the second data to the block at the second data rate when a number of available multi-level cell (MLC) blocks is below a hybrid single-level cell (SLC) block threshold.

4. The storage device of claim 1, wherein the controller is further configured to disable data relocation to the block when the temperature of the block meets the first temperature threshold.

5. The storage device of claim 1, wherein the block of cells include multi-level cells (MLCs), wherein the memory further has a block of single-level cell (SLCs), and wherein the controller is further configured to transfer stored data from the SLCs to the MLCs at increasing transfer rates when the temperature of the block is below the first temperature threshold.

6. The storage device of claim 1, wherein the controller is further configured to provide a message to a host of a decrease in data rate when the temperature of the block meets the second temperature threshold.

7. The storage device of claim 1, wherein the block of cells includes single-level cells (SLCs) or hybrid SLCs.

8. The storage device of claim 2, wherein the controller is further configured to write the second number of bits when a number of available single-level cell (SLC) blocks is below a SLC block threshold.

9. A storage device, comprising:
   a memory having a block of cells each configured to store a first number of bits; and
   a controller configured to write a second number of bits smaller than the first number of bits in each of one or more of the cells at a first data rate when a temperature of the block meets a first temperature threshold, and to write data to the block at a second data rate lower than the first data rate when the temperature of the block meets a second temperature threshold higher than the first temperature threshold.

10. The storage device of claim 9, wherein the controller is further configured to write the second number of bits when a number of single-level cell (SLC) blocks that are available for data writes is below a SLC block threshold.

11. The storage device of claim 9, wherein the controller is further configured to write the data to the block at the second data rate when a number of multi-level cell (MLC) blocks that are available for data writes is below a hybrid single-level cell (SLC) block threshold.

12. The storage device of claim 9, wherein the memory further has a block of single-level cells (SLCs), and wherein the controller is further configured to transfer stored data from the SLCs to the block at increasing transfer rates when the temperature of the block is below the first temperature threshold.

13. The storage device of claim 9, wherein the controller is further configured to provide a message to a host indicating a data rate decrease when the temperature of the block meets the second temperature threshold.

14. The storage device of claim 9, wherein the controller is further configured to disable writing data to the block when the temperature of the block meets a third temperature threshold higher than the second temperature threshold.

15. A storage device, comprising:
    a memory having a block of multi-level cells (MLCs); and
    a controller configured to store a single bit in each of one or more of the MLCs at a first data rate when a temperature of the block meets a first temperature threshold, to disable data relocation to the block when the temperature of the block meets the first temperature threshold, and to write data to the block of MLCs at a second data rate smaller than the first data rate when the temperature of the block meets a second temperature threshold.

16. The storage device of claim 15, wherein the controller is further configured to store the single bit in the each of the one or more of the MLCs when a number of available single-level cell (SLC) blocks is below a SLC block threshold.

17. The storage device of claim 15, wherein the controller is further configured to write the data to the block of MLCs at the second data rate when a number of MLC blocks that are available for data writes is below a hybrid single-level cell (SLC) block threshold.

18. The storage device of claim 15, wherein the controller is further configured to output a message indicating a decrease in data rate when the temperature of the block meets the second temperature threshold.

19. The storage device of claim 15, wherein the memory further has a block of single-level cells (SLCs), and wherein the controller is further configured to transfer stored data from the SLCs to the MLCs at different transfer rates when the temperature of the block is below the first temperature threshold.

20. The storage device of claim 15, wherein the controller is further configured to refrain from writing data to the block when the temperature of the block meets a third temperature threshold above the second temperature threshold.

\* \* \* \* \*